United States Patent
Nagaraj

(10) Patent No.: US 6,437,724 B1
(45) Date of Patent: Aug. 20, 2002

(54) FULLY DIFFERENTIAL FLASH A/D CONVERTER

(75) Inventor: Krishnaswamy Nagaraj, Somerville, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/662,274

(22) Filed: Sep. 14, 2000

Related U.S. Application Data

(60) Provisional application No. 60/163,887, filed on Nov. 5, 1999.

(51) Int. Cl.$^7$ ................................................. H03M 1/36
(52) U.S. Cl. ...................................... 341/159; 341/155
(58) Field of Search ................................ 341/155, 156, 341/157, 158, 159

(56) References Cited

U.S. PATENT DOCUMENTS

| | | | | |
|---|---|---|---|---|
| 4,229,729 A | * | 10/1980 | Devendorf et al. | 341/159 |
| 5,231,399 A | * | 7/1993 | Gorman et al. | 341/159 |
| 5,815,106 A | * | 9/1998 | Poss et al. | 341/159 |

* cited by examiner

Primary Examiner—Howard L. Williams
(74) Attorney, Agent, or Firm—W. Daniel Swayze, Jr.; W. James Brady; Frederick J. Telecky, Jr.

(57) ABSTRACT

An electronic circuit for converting an analog differential signal into a corresponding digital signal includes $2^n$ voltage comparators each having a first input terminal, a second input terminal and an output terminal. A first network of $2^n$ resistive elements is provided to which a first analog signal of the differential signal is applied, the first network having a plurality of first network nodes each coupled to the first input terminal of a corresponding one of the comparators and wherein one of the first network nodes is a first middle node coupled to the first analog signal. A second network of $2^n$ resistive elements is provided to which a second analog signal of the differential signal is applied, the second network having a plurality of second network nodes each coupled to the second input terminal of the corresponding one of the comparators and wherein one of the second network nodes is a second middle node coupled to the second analog signal. The disclosed circuit couples a differential input signal to the capacitor array without the need for capacitors. This simplifies implementation and saves power and area. Such analog-to-digital converters are vital for high speed data communication and storage application.

6 Claims, 3 Drawing Sheets

US 6,437,724 B1

FULLY DIFFERENTIAL FLASH A/D CONVERTER

This application claims priority under 35 USC §119(e)(1) of provisional application No. 60/163,887 filed Nov. 5, 1999.

TECHNICAL FIELD OF THE INVENTION

The present invention relates in general to the field of analog-to-digital conversion. More particularly, the present invention relates to a novel analog-to-digital converter circuit for high speed data communication and storage applications.

BACKGROUND OF THE INVENTION

Flash analog-to-digital converters (ADC's) are well known in the art. Such devices convert analog signals to corresponding digital signals instantly in parallel, and can be operated at very high speeds, typically up to 500 MHZ. As such, flash A/D converters are especially useful for high-speed data communications and storage applications.

Analog-to-digital conversion in flash devices is made possible by using a voltage divider and a reference voltage at the full-scale of the input range. In a typical flash device, the voltage divider includes $2^n$ resistors in series, where n is the number of bits representing the digital signal and $2^n$ is the analog-to-digital conversion resolution. The digital output of the device corresponding to a given analog input voltage is determined by using a comparator at each of the $2^n$ reference voltages created in the voltage divider. Typically, each comparator is implemented as a complementary metal oxide semiconductor (CMOS) device for added high-speed switching and low power consumption capabilities.

Comparison of the differential inputs and references is typically done using conventional circuits. A first conventional circuit 10, as shown in prior art FIG. 1, employs two CMOS differential pairs, pairs 12 and 16 and 14 and 18, coupled to the positive and negative inputs $V_p$ and $V_m$ of a comparator 20. Note, only one comparator (level) is shown. Such circuits however are usually undesirable for integrated circuit implementation due to their increased area and power dissipation requirements. Also, such circuits are characterized by reduced gain due to lower output impedance, and reduced speed due to larger load capacitance.

A second conventional circuit, as shown in prior art FIG. 2, employs capacitive coupling at the positive and negative inputs $V_p$ and $V_m$ of a voltage comparator 36. Again, only one comparator is shown. Capacitors 32 and 34 are provided at inputs $V_p$ and $V_m$, respectively, which are used to regulate and limit the differential inputs to $V_{refp}$ and $V_{refm}$ as determined by capacitance values $C_p$ and $C_m$. A shortcoming of such a circuit however is that the capacitors 32 and 34 are not easily realizable in combination with the CMOS technologies required for fabricating the amplifier 36. CMOS integrated circuits fabricated with such amplifiers and associated drivers require additional masks and fabrication techniques that add to the cost of the ADC's.

SUMMARY OF THE INVENTION

The aforedescribed limitations and inadequacies of conventional flash analog-to-digital converters (ADC's) are substantially overcome by the present invention, in which a principal object is to provide a flash analog-to-digital converter (ADC) for comparing a differential input signal with a fully differential reference signal.

Another object of the present invention to provide a fully differential flash ADC that can be easily implemented as a CMOS-based integrated circuit.

Yet another object of the present invention to provide a fully differential flash ADC having a reduced size.

Still another object of the present invention to provide a fully differential flash ADC characterized by low power consumption.

A further object of the present invention to provide a fully differential flash ADC for use in high speed data communication and storage applications.

Accordingly, a fully differential flash ADC is provided for converting an analog differential signal to a corresponding $2^n$-level (n-bit) digital signal. In accordance with a preferred embodiment of the present invention, the fully differential flash ADC includes $2^n$ voltage comparators each having a first input terminal and a second input terminal for the differential signal, and an output terminal for providing a comparator output signal. A first floating network of $2^n$ resistive elements is provided to which a first analog signal of the differential signal to be converted is applied. The first network includes a plurality of first network nodes coupled to the corresponding comparators via the first input terminals of the voltage comparators. The middle node, or first middle node, is coupled to the first analog signal so as to minimize time constants associated with the first network.

Similarly, a second floating network of $2^n$ resistive elements is provided to which a second analog signal of the differential signal to be converted is applied, the second network having a plurality of second network nodes each coupled to the second input terminal of the corresponding one of the comparators. The middle node of the second network is similarly coupled to the second analog signal for the purpose of minimizing the time constants associated with the second network.

Also, because the ladders are floating, the ladders do not impose any additional drive requirements on the output buffers of the S/H circuit.

Further objects, features and advantages of the invention will become apparent from the following detailed description taken in conjunction with the accompanying figures showing illustrative embodiments of the invention.

BRIEF DESCRIPTION OF THE DRAWINGS

For a complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
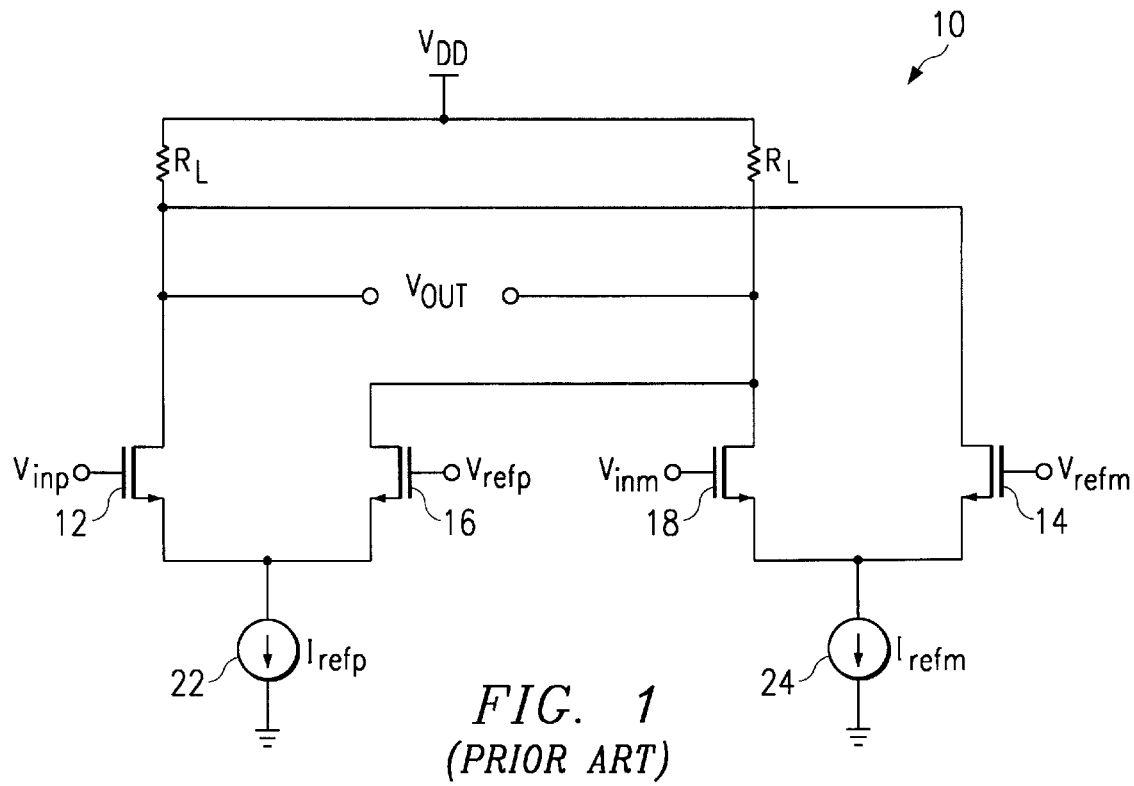
FIG. 1 is a circuit schematic of a conventional differential flash ADC.
Figure 2:
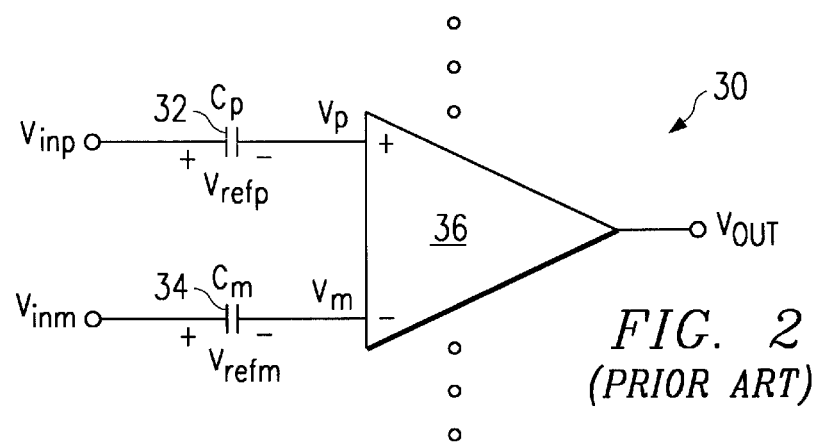
FIG. 2 is a circuit schematic of another conventional differential flash ADC.
Figure 3:
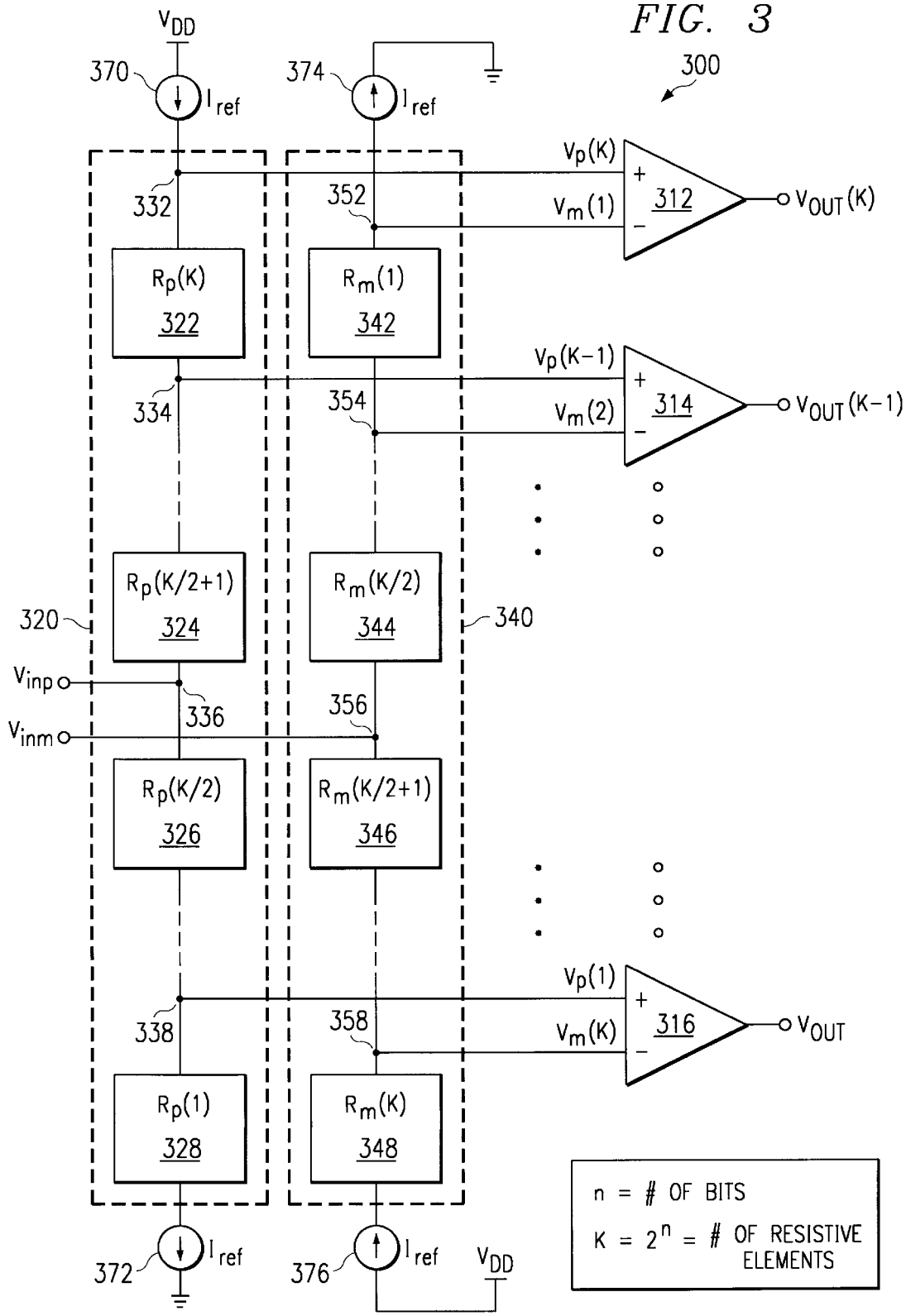
FIG. 3 is a circuit schematic of a fully differential flash ADC according to a preferred embodiment of the present invention.

FIG. 3 shows a circuit schematic of a fully differential flash analog-to-digital converter (ADC) in accordance with a preferred embodiment of the present invention. The circuit, as shown in FIG. 3, converts a differential signal defined by a first signal $V_{inp}$ and a second signal $V_{inm}$ to an n-bit digital signal having a resolution of $2^n$-levels, i.e., the digital signal can represent $2^n$ discrete voltage levels. The flash ADC of FIG. 4, for example, is designed to represent eight different analog levels, i.e., n=3 bits, k=$2^3$=8 levels.

Referring again to FIG. 3, the flash ADC 300 of the present invention includes $2^n$ voltage comparators, only 312, 314, and 316 shown, each having a first (positive) input terminal and a second (negative) input terminal. A first floating network 320 of k=$2^n$ resistive elements 322, 324, 326 and 328 (others not shown) is provided having as its input a first analog signal $V_{inp}$. The first network 320 is coupled to a voltage source $V_{DD}$ and a constant current supply 370 on one end, and a constant current supply 372 on the other end. The first network 320 further includes a plurality of first network nodes only 332, 334, 336 and 338 shown, each coupled to the first input terminal of a corresponding one of the comparators. One of the first network nodes, node 336, is a middle node coupled to the first analog signal $V_{inp}$.

A second floating network 340 of k=$2^n$ resistive elements 342, 344, 346, and 348 (others not shown) is also provided having as its input a second analog signal $V_{inm}$. The second network 340 is coupled to a voltage source $V_{DD}$ and a constant current supply 376 on one end, and a constant current supply 374 on the other end. The second network also includes a plurality of second network nodes 352, 354, 356, and 358, for example, for coupling to the second input terminal of the corresponding comparators. Further, the middle node 356 is coupled to the second analog signal $V_{inm}$.

Figure 4:
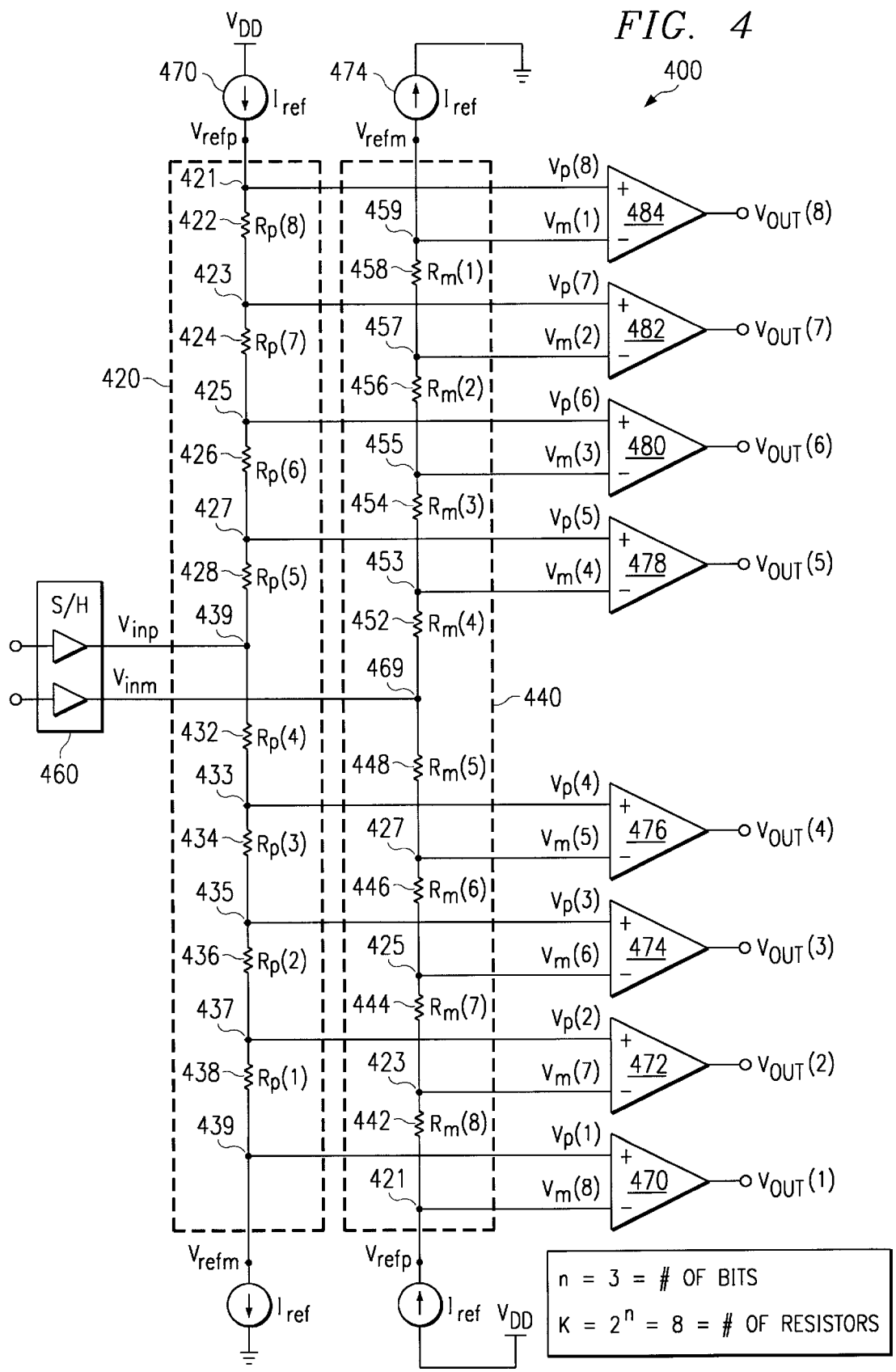
FIG. 4 is a circuit schematic of an 8-level (n=3 bits, k=$2^3$=8 levels) fully differential flash ADC according to a preferred embodiment of the present invention.

FIG. 4. is a circuit schematic of an 8-level (n=3 bits, k=$2^3$=8 levels) fully differential flash ADC. The flash ADC includes first and second floating voltage divider networks, 420 and 440 respectively, or so-called "resistor ladders", each coupled on either end by constant current sources 470, 472, 474 and 476. Each resistor ladder 420 and 440 includes eight resistors 422, 424, 426, 428, 432, 434, 435, 438 and 442, 444, 446, 448, 452, 454, 456 and 458 connected in series. The resistor values for the first voltage divider network 420 are chosen in accordance with the equation $I_{ref}=(V_{refp}-V_{refm})/R_p$, wherein $R_p=R_p(1)+R_p(2)+\ldots+R_p(8)$, $V_{refp}$ is the voltage at the "top" of the ladder network 420 and $V_{refm}$ is the voltage at the "bottom" of the ladder network 420. Similarly, the resistor values for the second voltage divider network 440 are chosen in accordance with the equation $I_{ref}=(V_{refp}-V_{refm})/R_m$, where $R_m=R_m(1)+R_m(2)+\ldots+R_m(8)$, $V_{refp}$ is the voltage at the "top" of the ladder network 440 and $V_{refm}$ is the voltage at the "bottom" of the ladder network 440. Further, each network is not tied to ground or any voltage supply. Nominally, each of the total resistance values $R_p$ and $R_m$ are equal, and each of the individual resistor values are equal to one-half the least significant bit (LSB), i.e., $R_p(k)=R_m(k)=0.5*LSB$, wherein the LSB is a voltage level defined by the equation $2*(V_{refp}-V_{refm})/2^n$.

In each of the first and second voltage divider networks 420 and 440, the middle nodes 439 and 459 are each coupled to the corresponding analog signals $V_{inp}$ and $V_{inm}$ so as to minimize time constants associated with the networks. Also, because the ladders are floating, there is no drive requirement on the output buffers of the S/H circuit.

Although the present invention has been described in connection with particular embodiments thereof, it is to be understood that such embodiments are susceptible of modification and variation without departing from the inventive concept disclosed. All such modifications and variations, therefore, are intended to be included within the spirit and scope of the appended claims.

What is claimed is:

1. An electronic circuit for converting an analog differential signal to a corresponding n-bit digital signal having a resolution of $2^n$ voltage levels, the differential signal being defined as the difference between a first analog signal and a second analog signal, said circuit comprising:

$2^n$ voltage comparators each having a first input terminal and a second input terminal for the differential signal, and an output terminal for providing a comparator output signal;

a first floating network of $2^n$ resistive elements connected in series to which the first analog signal is applied, said first network having a plurality of first network nodes each coupled to the first input terminal of a corresponding one of said comparators and wherein one of said first network nodes is a first middle node coupled to the first analog signal; and a second floating network of $2^n$ resistive elements connected in series to which the second analog signal is applied, said second network having a plurality of network nodes each coupled to the second input terminal of the corresponding one of said comparators and wherein one of said second network nodes is a second middle node coupled to the second analog signal, each comparator output signal representing at least in part the n-bit digital signal.

2. The circuit according to claim 1, further comprising:

a first pair of constant current sources coupled one each to both ends of said first floating network; and a second pair of constant current sources coupled one each to both ends of said second floating network.

3. The circuit according to claim 1, wherein the values of each of said resistive elements of said first and second floating networks are equal.

4. An electronic circuit for converting an analog differential signal to a corresponding three-bit digital signal having a resolution of eight voltage levels, the differential signal being defined as the difference between a first analog signal and a second analog signal, said analog-to-digital converter:

eight voltage comparators each having a first input terminal and a second input terminal for the differential signal, and an output terminal for providing a comparator output signal;

a first floating network of eight resistors connected in series to which the first analog signal is applied, said first network having a plurality of first network nodes each coupled to the first input terminal of a corresponding one of said comparators and wherein one of said first network nodes is a first middle node coupled to the first analog signal; and a second floating network of eight resistors connected in series to which the second analog signal is applied, said second network having a plurality of second network nodes each coupled to the second input terminal of the corresponding one of said comparators and wherein one of said second network nodes is a second middle node coupled to the second analog signal, each comparator output signal representing at least in part the n-bit digital signal.

5. The circuit according to claim 4, further comprising:

a first pair of constant current sources coupled one each to both ends of said first floating network; and a second pair of constant current sources coupled one each to both ends of said second floating network.

6. The circuit according to claim 4, wherein the values of each of said resistors of said first and second floating networks are equal.

* * * * *